United States Patent
Chen et al.

(10) Patent No.: US 10,463,150 B2
(45) Date of Patent: Nov. 5, 2019

(54) SLIDE RAIL ASSEMBLY

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Kai-Wen You, Kaohsiung (TW); Chun-Chiang Wang, Kaohsiung (TW)

(73) Assignees: King Slide Works Co., Ltd., Kaohsiung (TW); King Slide Technology Co., Ltd., Kaohsiung (TW)

( * ) Notice: Subject to any disclaimer, the term of this patent is extended or adjusted under 35 U.S.C. 154(b) by 0 days.

(21) Appl. No.: 15/890,377

(22) Filed: Feb. 7, 2018

(65) Prior Publication Data

US 2018/0360214 A1 Dec. 20, 2018

(30) Foreign Application Priority Data

Jun. 20, 2017 (TW) .............................. 106120805 A (51) Int. Cl.
| | | |
|---|---|---|
| F16M 13/00 | (2006.01) | |
| A47B 88/493 | (2017.01) | |
| F16L 3/01 | (2006.01) | |
| H05K 7/14 | (2006.01) | |
| H05K 7/18 | (2006.01) | |

(52) U.S. Cl.
CPC .............. *A47B 88/493* (2017.01); *F16L 3/01* (2013.01); *H05K 7/1489* (2013.01); *H05K 7/183* (2013.01); *H05K 7/1491* (2013.01)

(58) Field of Classification Search
CPC .............................. H05K 7/1489; A47B 96/07
See application file for complete search history.

(56) References Cited

U.S. PATENT DOCUMENTS

| | | | | |
|---|---|---|---|---|
| 9,144,173 | B2* | 9/2015 | Chen | H05K 7/1489 |
| 9,504,181 | B2* | 11/2016 | Chen | H05K 7/1489 |
| 9,635,942 | B2* | 5/2017 | Chen | A47B 96/07 |
| 9,848,702 | B2 | 12/2017 | Chen et al. | |
| 9,848,703 | B2 | 12/2017 | Chen et al. | |
| 9,867,308 | B2* | 1/2018 | Chen | H05K 7/1489 |
| 2014/0217049 | A1* | 8/2014 | Chen | H05K 7/1489 |
| | | | | 211/195 |

* cited by examiner

*Primary Examiner* — Amy J. Sterling
(74) *Attorney, Agent, or Firm* — Rosenberg, Klein & Lee (57) ABSTRACT

A slide rail assembly includes a first rail, a second rail, a third rail, and at least one supporting structure. The second rail is movable with respect to the first rail. The third rail is mounted between the first rail and the second rail. The at least one supporting structure is disposed at a position relative to the first rail. When the second rail is at a predetermined position relative to the first rail, the third rail supports a portion of the second rail, and the at least one supporting structure supports the remaining portion of the second rail.

11 Claims, 11 Drawing Sheets

SLIDE RAIL ASSEMBLY

FIELD OF THE INVENTION

The present invention relates to a slide rail assembly and more particularly to one with a supporting mechanism for increasing the strength with which a slide rail is supported.

BACKGROUND OF THE INVENTION

Figure 1:
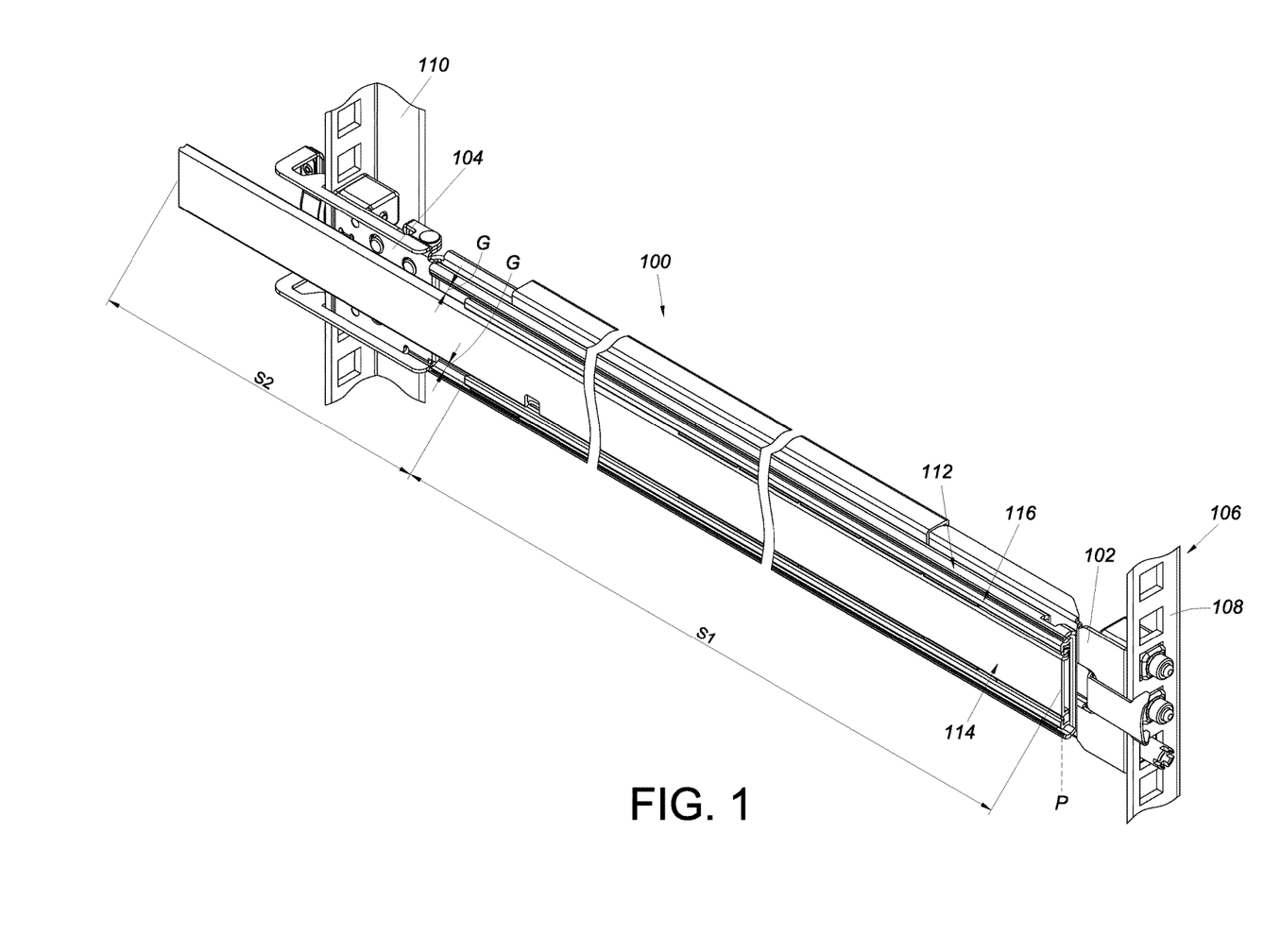
FIG. 1 shows that a conventional slide rail assembly is mounted to a rack, and a rail section of a slide rail of the slide rail assembly is inadequately supported.

In the rack system shown in FIG. 1, the slide rail assembly 100 is mounted to the first post 108 and the second post 110 of the rack 106 via the first bracket 102 and the second bracket 104 respectively. The slide rail assembly 100 typically includes a plurality of slide rails such as the first rail 112, the second rail 114, and the third rail 116. The first rail 112 is mounted to the first post 108 and the second post 110 via the first bracket 102 and the second bracket 104 respectively. The third rail 116 is movably mounted between the first rail 112 and the second rail 114. The second rail 114 is substantially configured to be mounted with the object to be carried by the slide rail assembly 100, such as a chassis.

Nowadays, the object to be carried by the slide rail assembly 100 tends to be wider and wider in order to accommodate more electronic components or devices. It is therefore important that the slide rails of the slide rail assembly 100 do not occupy the mounting space of the object to be carried. One prior art approach is to mount the first rail 112 in the space between the first post 108 and the second post 110 through the first bracket 102 and the second bracket 104, lest the first rail 112 take up the mounting space of the object. This arrangement, however, inevitably gives rise to the problem that the rail section S2 of the second rail 114 is inadequately supported while the second rail 114 is at a certain position relative to the first rail 112, even though the remaining rail section S1 of the second rail 114 is supported by the third rail 116. For example, the gap G between the second rail 114 and the first rail 112 makes it impossible to provide sufficient support for the rail section S2 of the second rail 114.

Figure 2:
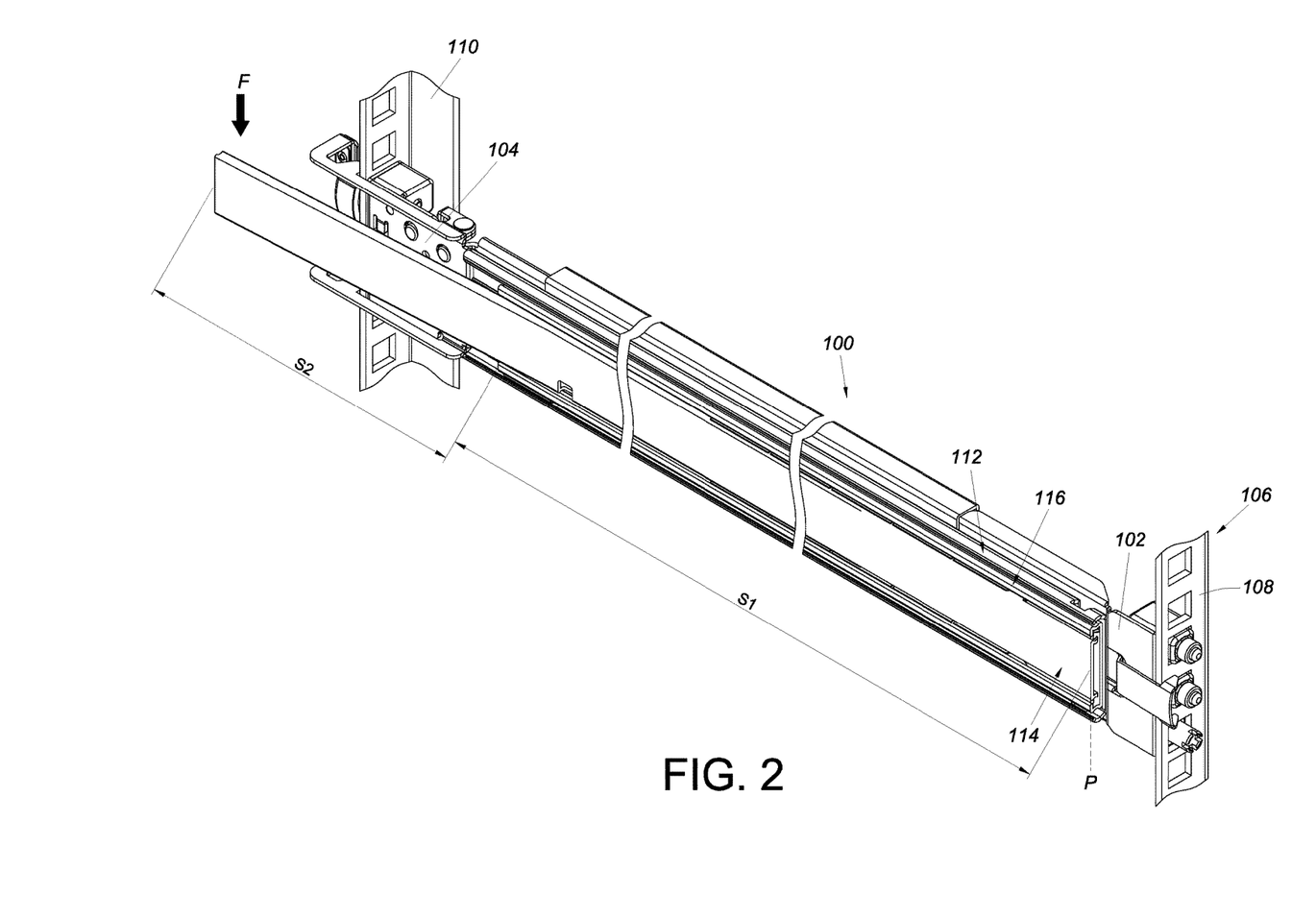
FIG. 2 shows that the inadequately supported rail section of the conventional slide rail assembly may deform when subjected to force application.

Referring to FIG. 2, if the second rail 114 is mounted with the object to be carried but the rail section S2 of the second rail 114 does not receive sufficient support, the rail section S2 of the second rail 114 may bend or deform due to the weight F of the object such that the slide rail assembly 100 is damaged.

SUMMARY OF THE INVENTION

One objective of the present invention is to provide a slide rail assembly that has a supporting mechanism for increasing the strength with which a slide rail is supported with respect to another.

According to one aspect of the invention, a slide rail assembly includes a first rail, a second rail, a third rail, and at least one supporting structure. The second rail can be moved with respect to the first rail. The third rail is mounted between the first rail and the second rail. The at least one supporting structure is disposed at a position relative to the first rail. When the second rail is at the predetermined position relative to the first rail, the third rail and the at least one supporting structure support two portions of the second rail respectively.

Preferably, when the second rail is at the predetermined position relative to the first rail, the third rail supports a rail section of the second rail while the at least one supporting structure supports a portion of the remaining rail section of the second rail.

Preferably, the at least one supporting structure is connected to the first rail via an extension member.

Preferably, the extension member includes an extension channel, through which the second rail extends.

Preferably, the extension member is coupled to the first rail at a position adjacent to a rear portion of the first rail.

Preferably, the extension member includes an upper portion, a lower portion, and a side portion connected between the upper portion and the lower portion. The upper portion, the lower portion, and the side portion jointly define the extension channel, through which the second rail extends and in which the at least one supporting structure is located.

Preferably, the supporting structure is a slide facilitating device.

Alternatively, the slide rail assembly further includes a slide facilitating device in addition to the supporting structure. The slide facilitating device is mounted in the extension channel and includes a plurality of rolling members in contact with the second rail.

Preferably, the slide rail assembly is adapted for a cable management device, wherein the cable management device includes a first arm and a second arm that can be moved with respect to the first arm. The slide rail assembly in that case preferably further includes a first connecting member coupled to the extension member and a second connecting member coupled to the second rail, wherein the first connecting member is configured to be connected to the first arm while the second connecting member is configured to be connected to the second arm.

Preferably, the second rail includes an upper wall, a lower wall, and a sidewall connected between the upper wall and the lower wall of the second rail; and when the second rail is at the predetermined position relative to the first rail, the at least one supporting structure at least supports a portion of the lower wall of the second rail, preferably a portion of the lower wall of aforesaid remaining rail section of the second rail.

According to another aspect of the invention, a slide rail assembly is adapted for a cable management device, wherein the cable management device includes a first arm and a second arm that can be moved with respect to the first arm, and wherein the slide rail assembly includes a first rail, a second rail, at least one supporting structure, a first connecting member, and a second connecting member. The second rail can be moved with respect to the first rail. The at least one supporting structure is connected to the first rail via an extension member. The first connecting member is coupled to the extension member, and the second connecting member is coupled to the second rail. The first connecting member is configured to be connected to the first arm, and the second connecting member is configured to be connected to the second arm. When the second rail is at a predetermined position relative to the first rail, the at least one supporting structure supports the second rail.

DETAILED DESCRIPTION OF THE INVENTION

Figure 3:
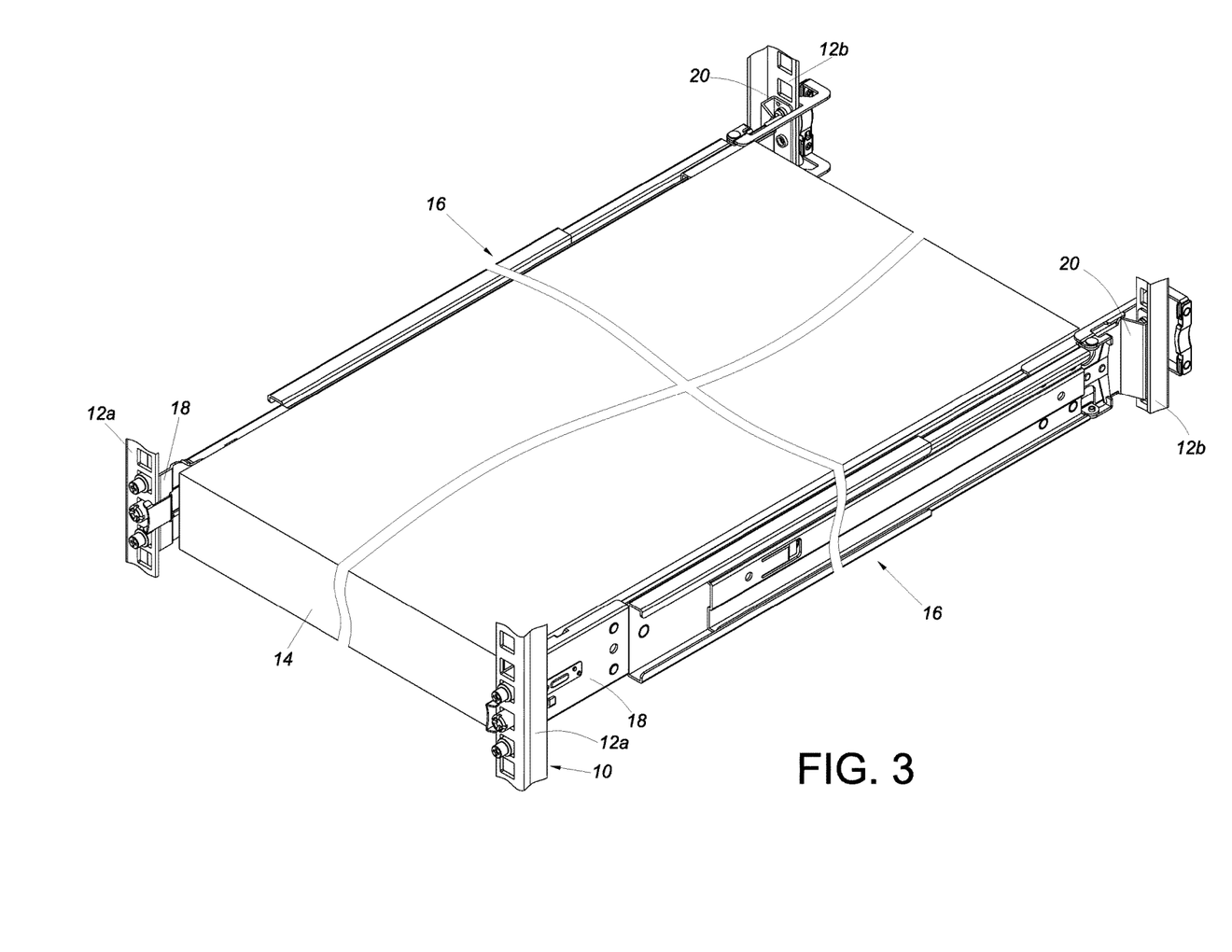
FIG. 3 shows that a pair of slide rail assemblies in the first embodiment of the present invention mount an object to a rack.

Referring to FIG. 3, a rack 10 includes a plurality of posts, such as a pair of first posts 12a and a pair of second posts 12b. An object 14, such as the chassis of a piece of electronic equipment, is mounted on the rack 10 via a pair of slide rail assemblies 16. More specifically, each slide rail assembly 16 in the first embodiment of the present invention is mounted to the corresponding first post 12a and the corresponding second post 12b through a first bracket 18 and a second bracket 20 respectively.

Figure 4:
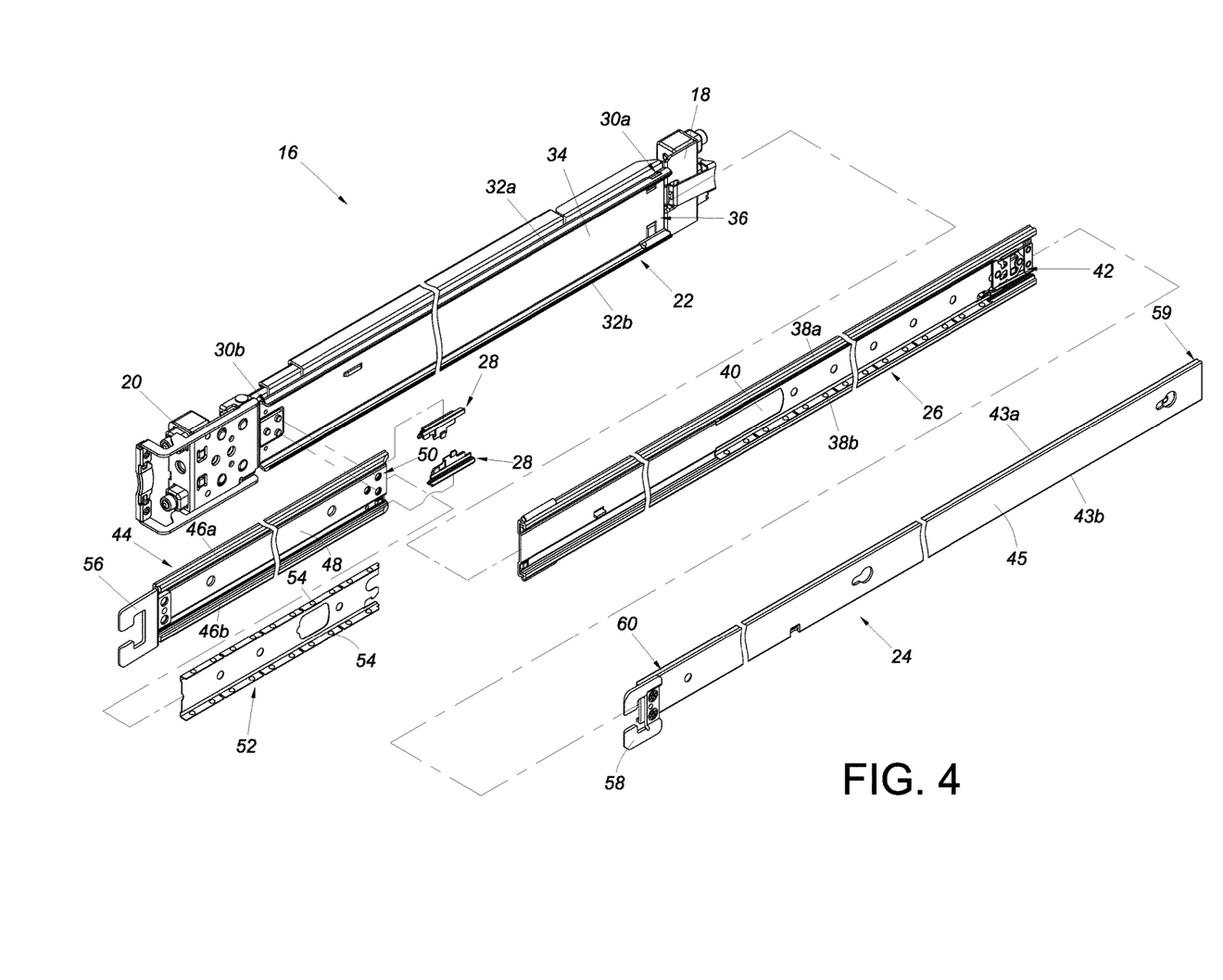
FIG. 4 is an exploded view of the slide rail assembly in the first embodiment of the present invention.
Figure 5:
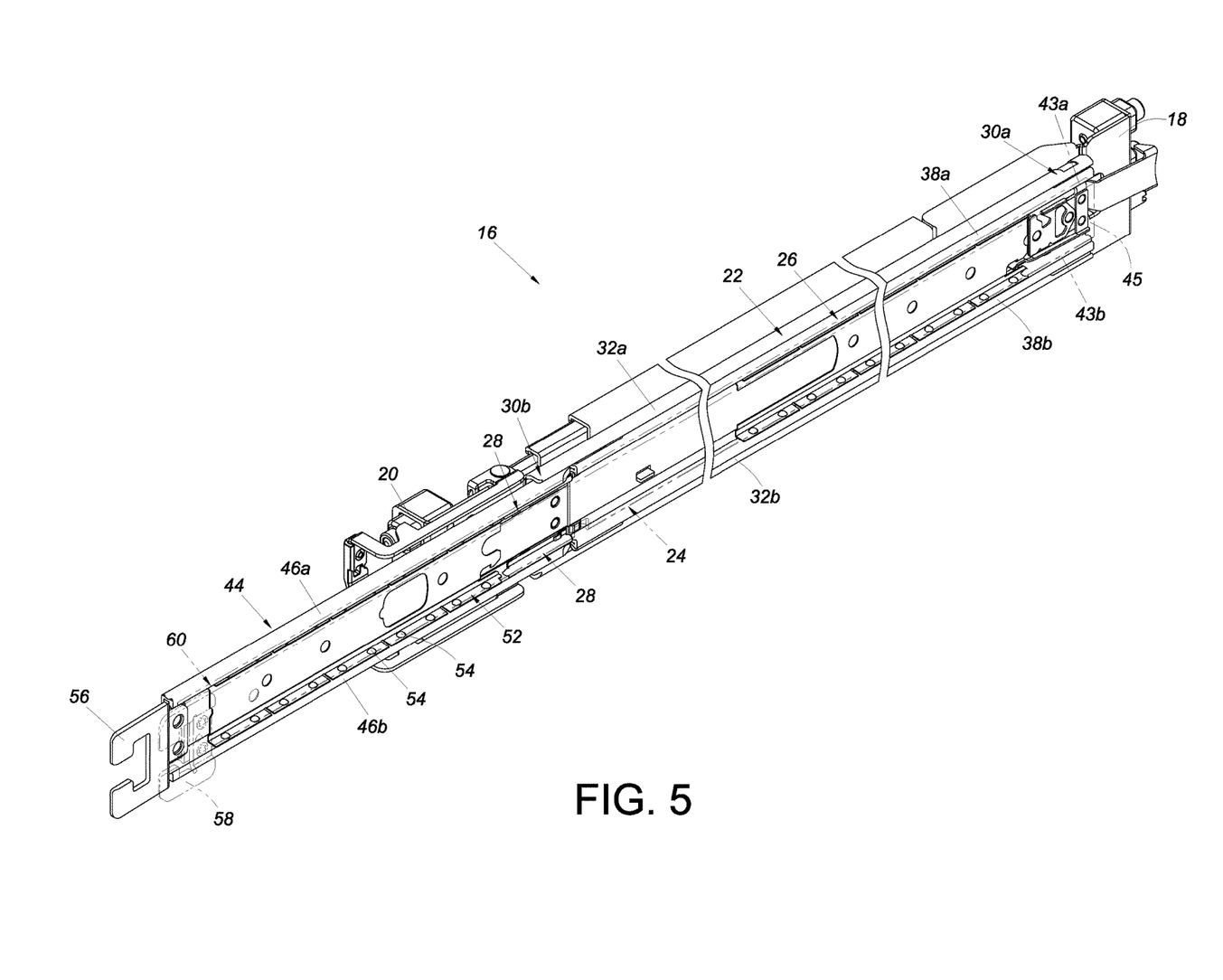
FIG. 5 is an assembled view of the slide rail assembly in the first embodiment of the present invention.

Referring to FIG. 4 and FIG. 5, the slide rail assembly 16 includes a first rail 22, a second rail 24, at least one supporting structure 28, and preferably also a third rail 26 movably mounted between the first rail 22 and the second rail 24. The third rail 26 serves to increase the distance for which the second rail 24 can be moved with respect to the first rail 22.

As shown in FIG. 4 and FIG. 5, the first rail 22 has a front portion 30a and a rear portion 30b. The first bracket 18 is arranged at a position adjacent to the front portion 30a of the first rail 22, and the second bracket 20 is arranged at a position adjacent to the rear portion 30b of the first rail 22. More specifically, the first rail 22 includes an upper wall 32a, a lower wall 32b, and a sidewall 34 connected between the upper wall 32a and the lower wall 32b of the first rail 22. The upper wall 32a, the lower wall 32b, and the sidewall 34 of the first rail 22 jointly define a channel 36.

The third rail 26 is movably mounted in the channel 36 of the first rail 22. The third rail 26 includes an upper wall 38a, a lower wall 38b, and a sidewall 40 connected between the upper wall 38a and the lower wall 38b of the third rail 26. The upper wall 38a, the lower wall 38b, and the sidewall 40 of the third rail 26 jointly define a channel 42.

The second rail 24 can be moved with respect to the first rail 22. Here, by way of example, the second rail 24 can be moved with respect to the first rail 22 through the third rail 26. More specifically, the second rail 24 is movably mounted in the channel 42 of the third rail 26 and has a front portion 59 and a rear portion 60. The second rail 24 includes an upper wall 43a, a lower wall 43b, and a sidewall 45 connected between the upper wall 43a and the lower wall 43b of the second rail 24. The at least one supporting structure 28 is disposed at a position relative to the first rail 22. For example, an extension member 44 is coupled to the first rail 22 at a position adjacent to the rear portion 30b of the first rail 22, and the at least one supporting structure 28 is connected to the first rail 22 via the extension member 44. The extension member 44 may be fixedly connected to the first rail 22 at a position adjacent to the rear portion 30b by riveting, soldering, threaded connection, or an assembly process. In other embodiments, the extension member 44 may be movably mounted instead to the first rail 22 at a position adjacent to the rear portion 30b.

Preferably, the at least one supporting structure 28 in this embodiment includes two such structures, each formed as a projection or wall. Preferably, the extension member 44 includes an upper portion 46a, a lower portion 46b, and a side portion 48 connected between the upper portion 46a and the lower portion 46b; and the upper portion 46a, the lower portion 46b, and the side portion 48 jointly define an extension channel 50. The extension channel 50 is aligned with or faces the channel 42 of the third rail 26. The second rail 24 extends through the extension channel 50, and the two supporting structures 28 are located on the upper and lower sides of the interior of the extension channel 50 respectively. For example, the two supporting structures 28 are fixed to the upper portion 46a and the lower portion 46b of the extension member 44 respectively. Alternatively, the two supporting structures 28 may be integrally formed with the upper portion 46a and the lower portion 46b of the extension member 44 respectively, and in that case, the two supporting structures 28 and the extension member 44 can be viewed as a single unit. As another alternative, the two supporting structures 28 may be movably mounted to the upper portion 46a and the lower portion 46b of the extension member 44 respectively. The present invention has no limitation on how the at least one supporting structure 28 is mounted with respect to the extension member 44.

Preferably, the slide rail assembly 16 further includes a slide facilitating device 52 mounted in the extension channel 50. The slide facilitating device 52 includes a plurality of rolling members 54 such as balls or rollers.

Preferably, the slide rail assembly 16 further includes a first connecting member 56 and a second connecting member 58. The first connecting member 56 is coupled to the extension member 44 while the second connecting member 58 is coupled to the second rail 24. For example, the first connecting member 56 may be fixedly connected to the extension member 44 by riveting, soldering, threaded connection, or an assembly process, and the second connecting member 58 may be fixedly connected to the second rail 24 at a position adjacent to the rear portion 60 by riveting, soldering, threaded connection, or an assembly process.

Figures 6, 7:
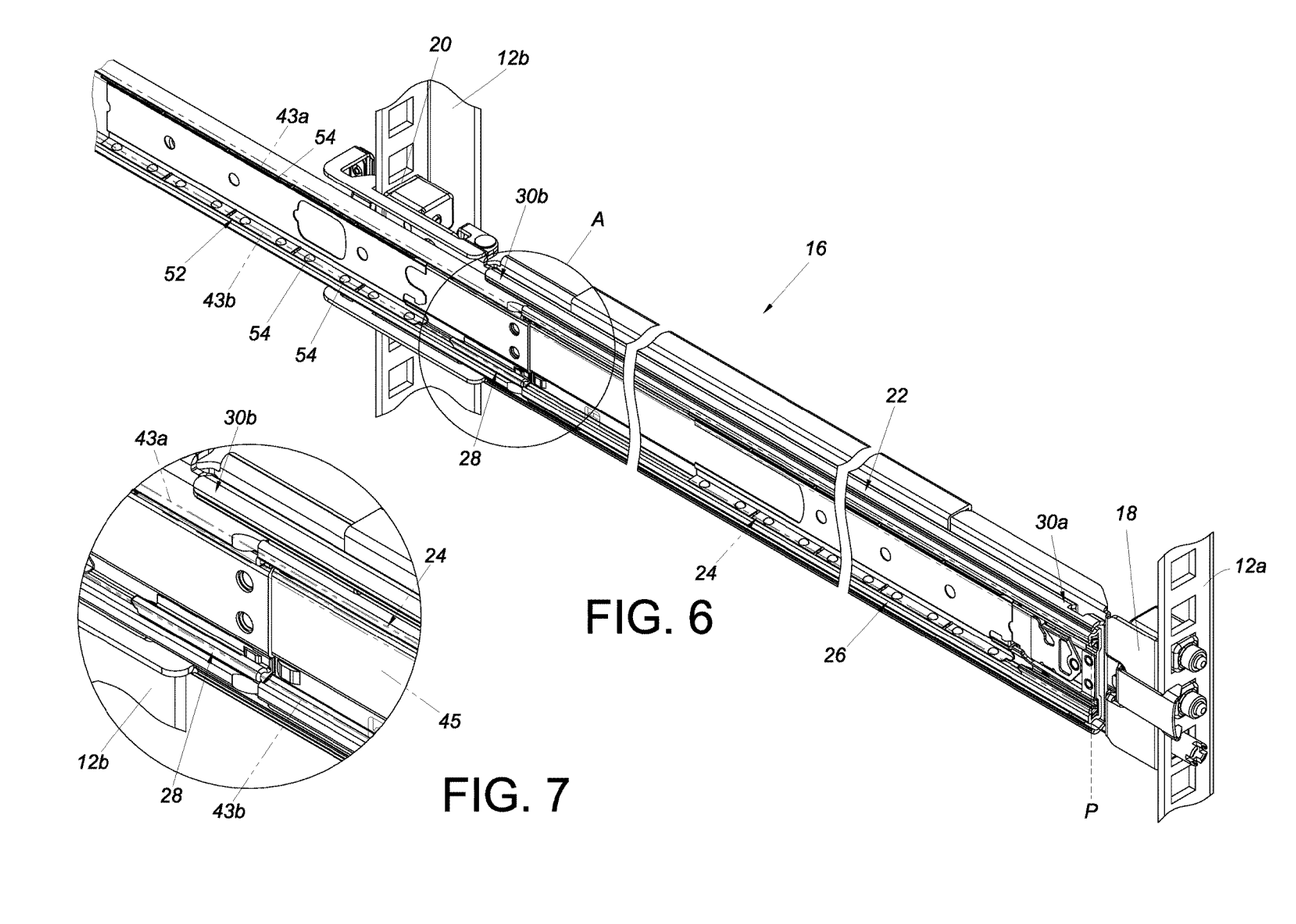
FIG. 6 shows that the slide rail assembly in the first embodiment of the present invention is mounted to a rack.
FIG. 7 is an enlarged view of the circled area A in FIG. 6.

Referring to FIG. 6 and FIG. 7, the front portion 30a of the first rail 22 is mounted to the first post 12a via the first bracket 18, and the rear portion 30b of the first rail 22 is mounted to the second post 12b via the second bracket 20. As a result, the first rail 22 lies in the space between the first post 12a and the second post 12b, allowing the two second rails 24 of the pair of slide rail assemblies 16 (see FIG. 3) to have a relatively great mounting width therebetween, thereby enabling the mounting of a relatively large chassis in between the slide rail assemblies 16.

With continued reference to FIG. 6 and FIG. 7, when the second rail 24 is at a predetermined position P relative to the first rail 22, the third rail 26 supports a certain rail section of the second rail 24 (e.g., a front rail section of the second rail 24, or more particularly the lower wall 43b of the front rail section of the second rail 24). Meanwhile, the at least one supporting structure 28 supports a portion of the remaining rail section of the second rail 24 (e.g., a portion of a rear rail section of the second rail 24, or more particularly a portion of the lower wall 43b of the rear rail section of the second rail 24). The predetermined position P may be a retracted position but is not limited thereto.

It can be known from the above that, when the second rail 24 is at the predetermined position P, the third rail 26 and the at least one supporting structure 28 support two portions of the second rail 24 (e.g., the lower wall 43b of the front rail section and the lower wall 43b of the rear rail section of the second rail 24) respectively.

Moreover, when the second rail 24 is at the predetermined position P relative to the first rail 22, the rolling members 54 of the slide facilitating device 52 are preferably in contact with the upper wall 43a and the lower wall 43b of the rear rail section of the second rail 24, in order for the slide facilitating device 52 to support the aforesaid remaining rail section (e.g., the rear rail section) of the second rail 24, too. This arrangement helps increase the strength with which the second rail 24 is supported when the second rail 24 is at the predetermined position P relative to the first rail 22.

Figure 8:
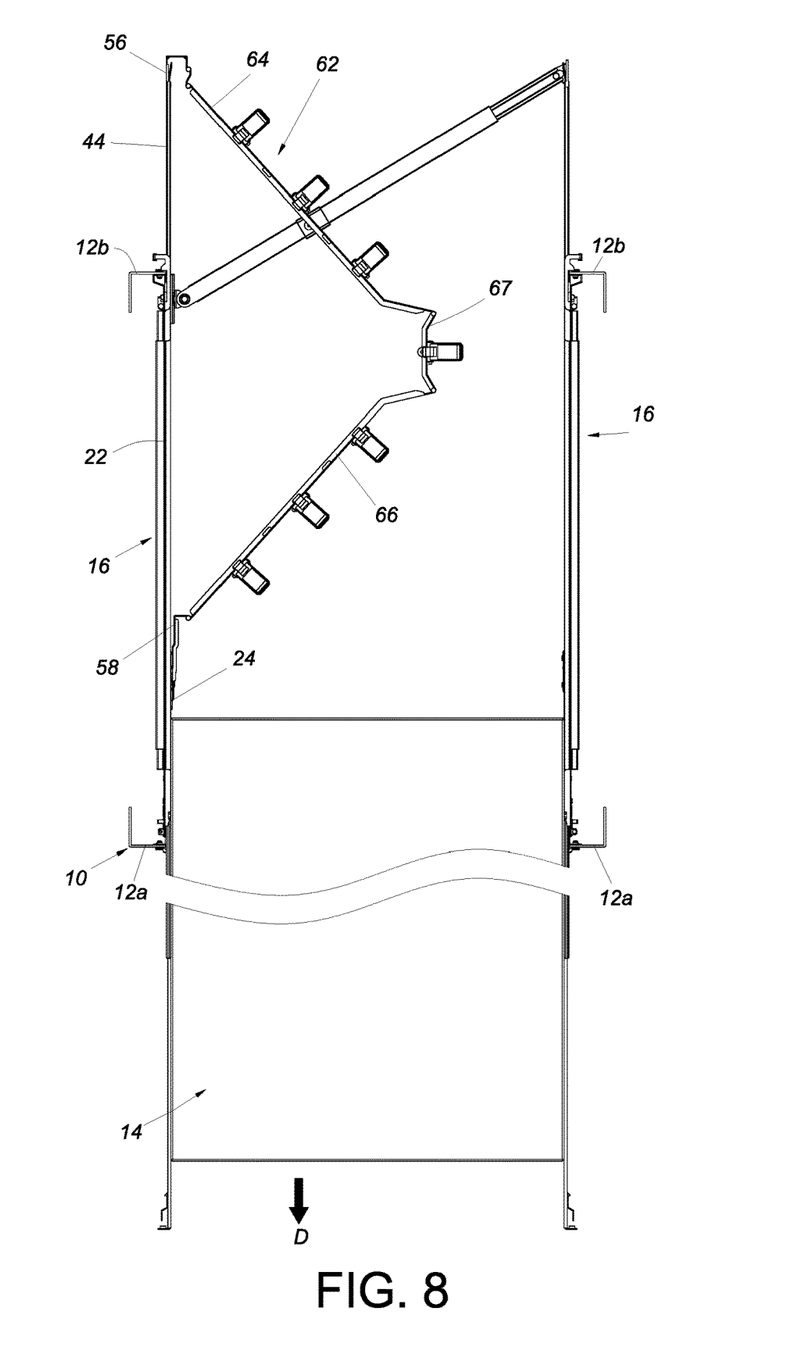
FIG. 8 shows that the pair of slide rail assemblies in the first embodiment of the present invention not only can mount an object to a rack, but also can be mounted with a cable management device.

Referring to FIG. 8, the pair of slide rail assembles 16 are adapted for a cable management device 62 that is configured to arrange cables trailing along behind the object 14. More specifically, the cable management device 62 includes a first arm 64 and a second arm 66 movable with respect to the first arm 64. The first arm 64 and the second arm 66 are preferably pivotally connected to each other. For example, the first arm 64 and the second arm 66 are pivotally connected via a pivotal connection base 67.

More specifically, one of the pair of slide rail assemblies 16 in FIG. 8 includes the first connecting member 56 and the second connecting member 58. The first connecting member 56 and the second connecting member 58 are coupled to the extension member 44 and the second rail 24 respectively, and are configured to be connected to the first arm 64 and the second arm 66 respectively. The second rails 24, as stated above, serve to carry the object 14.

When the object 14 is pulled out in an opening direction D, the second rails 24 are displaced in the opening direction D with respect to the first rails 22 from inside the rack 10 to outside the rack 10, and in response to the displacement of the second rails 24, the second arm 66 of the cable management device 62 is opened with respect to the first arm 64.

Figures 9, 10:
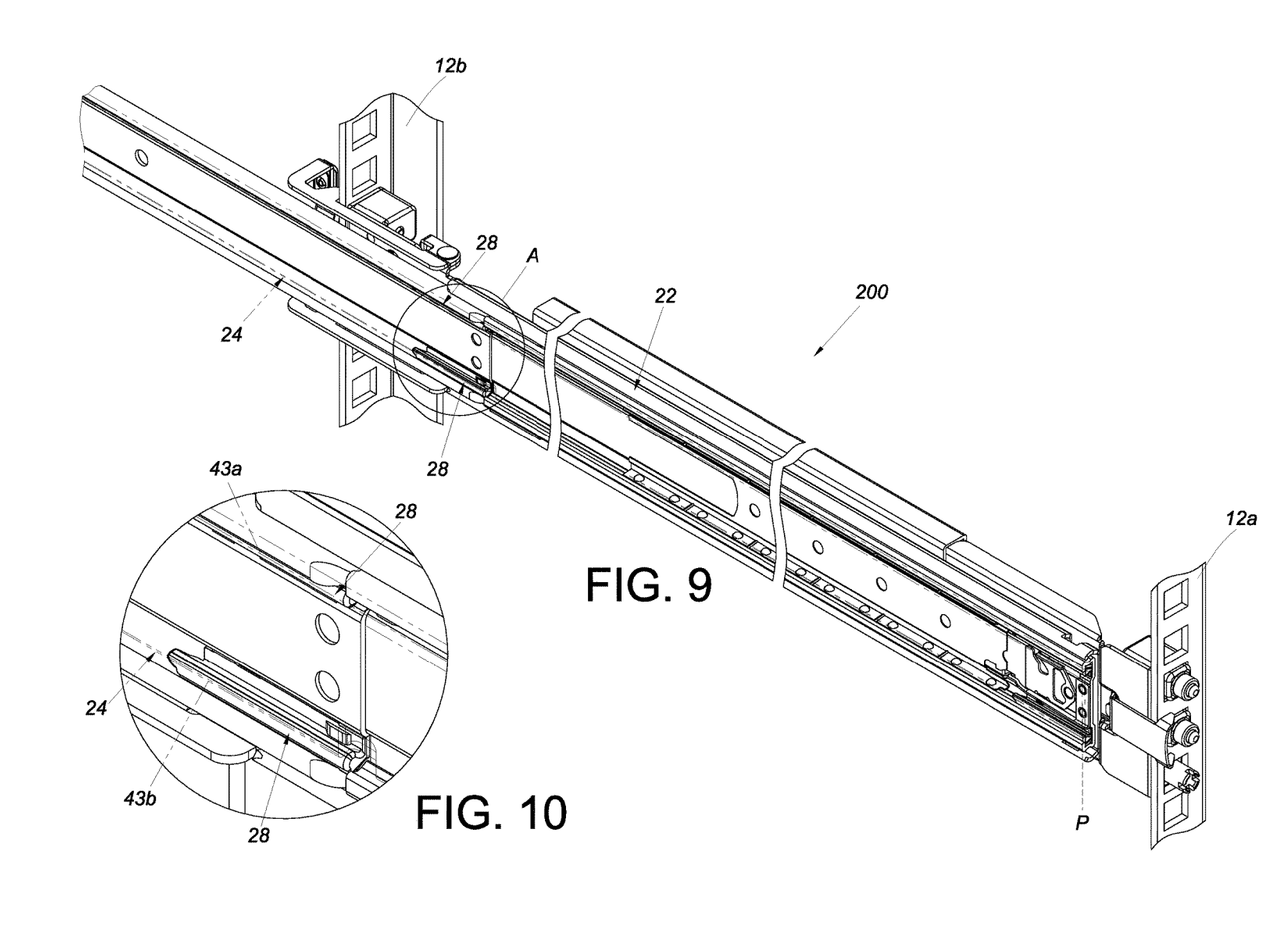
FIG. 9 shows that a slide rail assembly in the second embodiment of the invention is mounted to a rack.
FIG. 10 is an enlarged view of the circled area A in FIG. 9.

FIG. 9 and FIG. 10 shows that a slide rail assembly 200 in the second embodiment of the present invention is mounted to the first post 12a and the second post 12b. The slide rail assembly 200 is different from its counterpart in the first embodiment substantially in that the former does not include the slide facilitating device 52 of the latter.

Figures 11, 12:
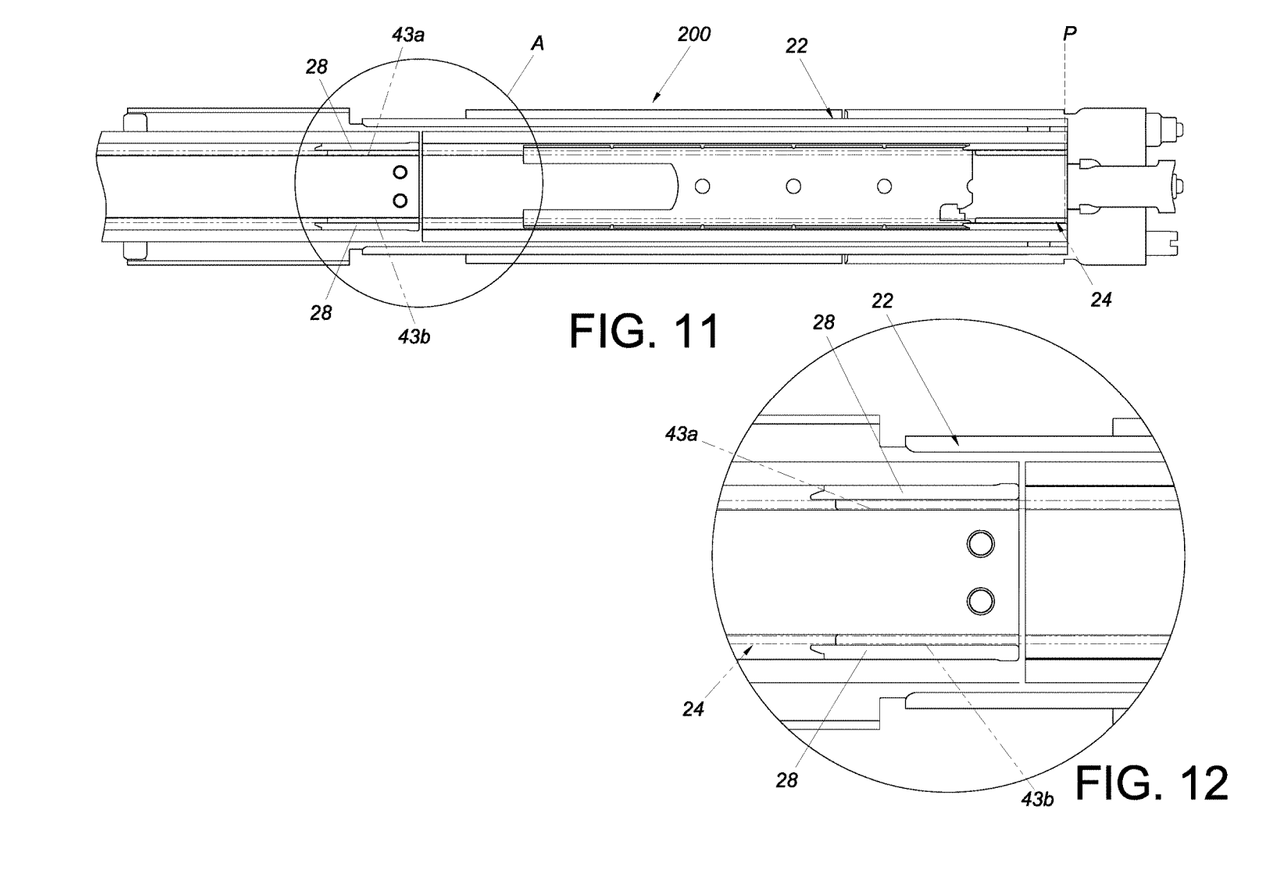
FIG. 11 is a schematic drawing of the slide rail assembly in the second embodiment of the invention.
FIG. 12 is an enlarged view of the circled area A in FIG. 11.

When the second rail 24 is at the predetermined position P (e.g., a retracted position) relative to the first rail 22, the at least one supporting structure 28 provides support for the aforesaid remaining rail section of the second rail 24. For example, the two supporting structures 28 support the upper wall 43a and the lower wall 43b of the rear rail section of the second rail 24 respectively (see FIG. 11 and FIG. 12).

Figure 13:
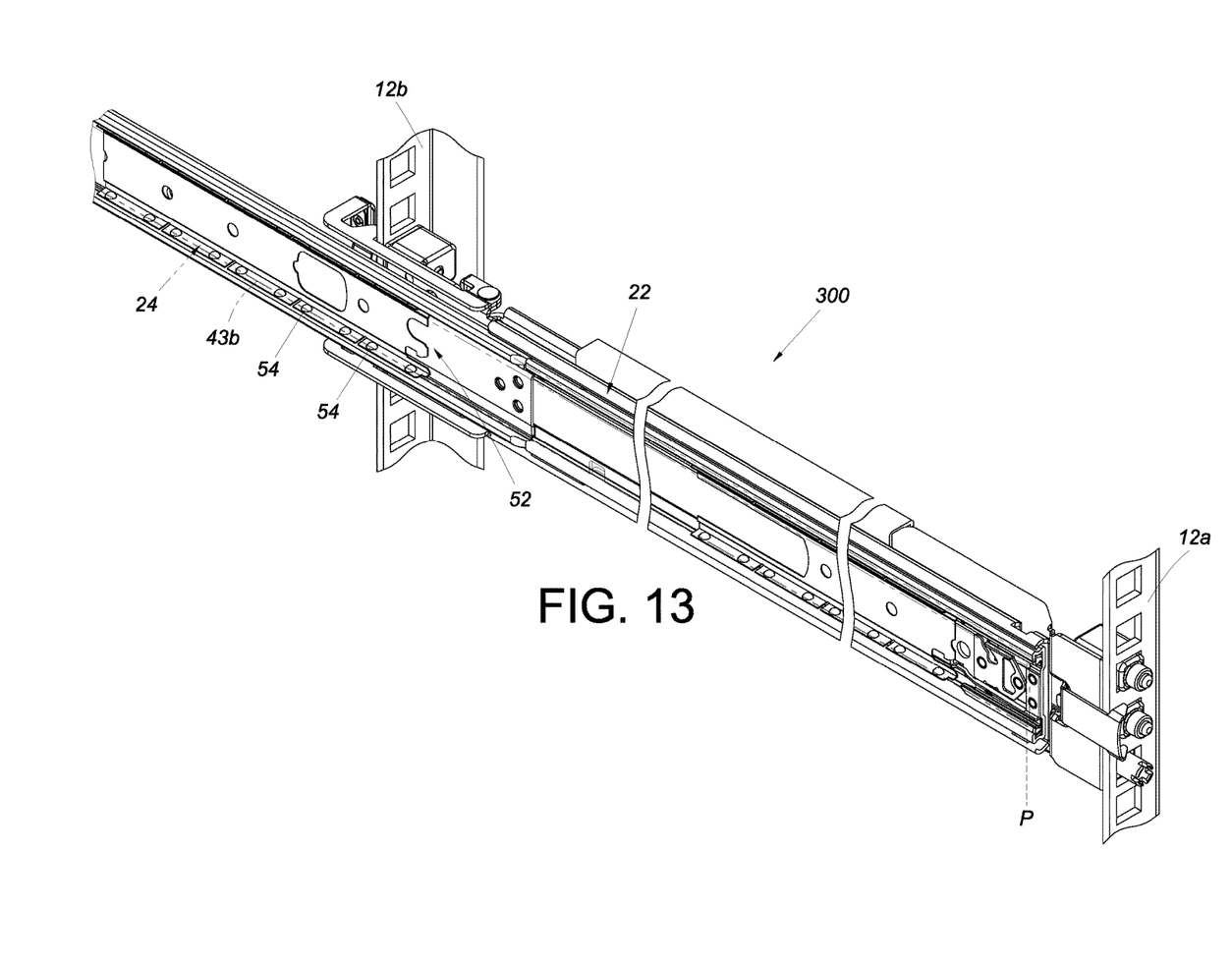
FIG. 13 shows that a slide rail assembly in the third embodiment of the invention is mounted to a rack.

FIG. 13 shows that a slide rail assembly 300 in the third embodiment of the present invention is mounted to the first post 12a and the second post 12b. The slide rail assembly 300 is different from its counterpart in the first embodiment substantially in that the former does not include the at least one supporting structure 28 of the latter, and that the slide facilitating device 52 of the former can work in place of the at least one supporting structure 28 of the latter.

Figure 14:
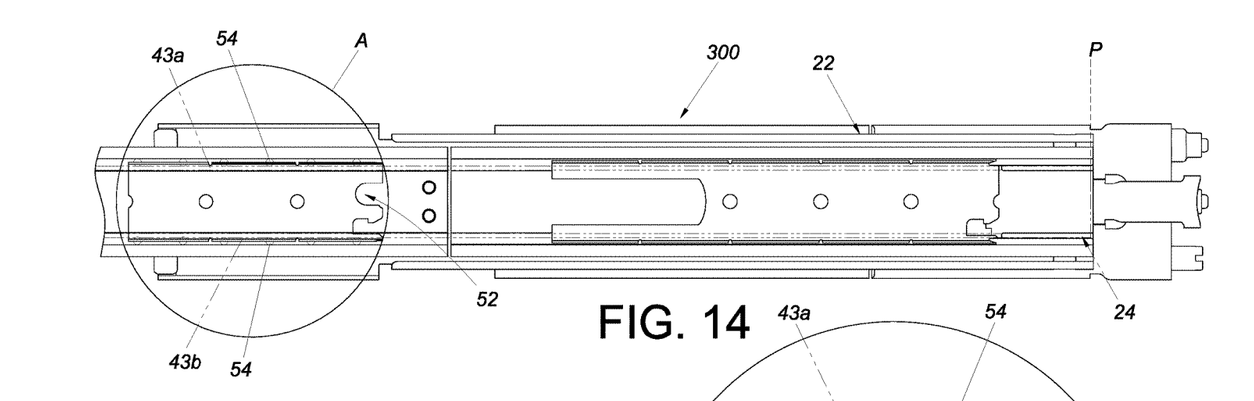
FIG. 14 is a schematic drawing of the slide rail assembly in the third embodiment of the invention.
Figure 15:
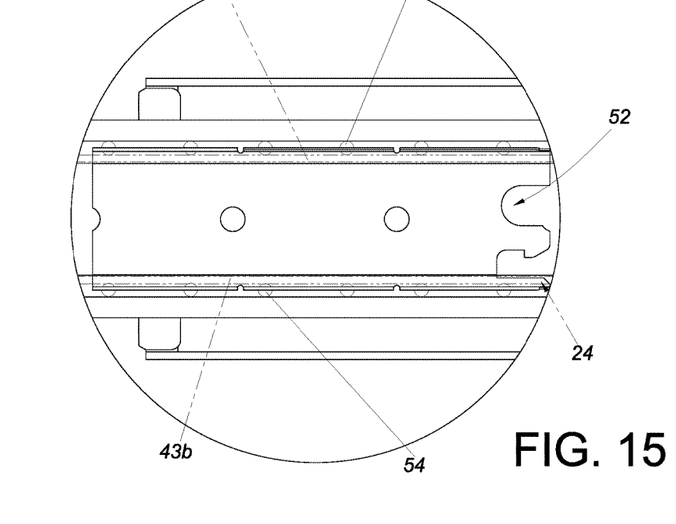
FIG. 15 is an enlarged view of the circled area A in FIG. 14.

When the second rail 24 is at the predetermined position P (e.g., a retracted position) relative to the first rail 22, the rolling members 54 of the slide facilitating device 52 provide support for the aforesaid remaining rail section of the second rail 24. For example, the rolling members 54 of the slide facilitating device 52 not only facilitate displacement of the second rail 24 with respect to the first rail 22, but also support the upper wall 43a and the lower wall 43b of the rear rail section of the second rail 24 (see FIG. 14 and FIG. 15).

To sum up, the slide rail assemblies in the foregoing embodiments of the present invention preferably have the following features:

1. When the second rail 24 is at the predetermined position P relative to the first rail 22, the third rail 26 supports a certain rail section of the second rail 24, and the at least one supporting structure 28 supports a portion of the remaining rail section of the second rail 24.
2. The at least one supporting structure 28 is located at the first rail 22 and may be a projection (as in the first embodiment and the second embodiment), or the slide facilitating device 52 can double as the at least one supporting structure (as in the third embodiment).
3. The slide rail assemblies are adapted for the cable management device 62, which includes the first arm 64 and the second arm 66 movable with respect to the first arm 64.

While the present invention has been disclosed by way of the preferred embodiments described above, it should be understood that those embodiments are not intended to be restrictive of the scope of the invention. The scope of patent protection sought by the applicant is defined by the appended claims.

What is claimed is:

1. A slide rail assembly, comprising:
   a first rail;
   a second rail movable with respect to the first rail;
   a third rail mounted between the first rail and the second rail; and
   at least one supporting structure disposed at a position relative to the first rail, the at least one supporting structure being connected to the first rail via an extension member, and the extension member is coupled to the first rail at a position adjacent to a rear portion of the first rail;
   wherein when the second rail is at a predetermined position relative to the first rail, the third rail supports a rail section of the second rail, and the at least one supporting structure supports a portion of a remaining rail section of the second rail.

2. The slide rail assembly of claim 1, wherein the extension member includes an upper portion, a lower portion, and a side portion connected between the upper portion and the lower portion; the upper portion, the lower portion, and the side portion jointly define an extension channel through which the second rail extends; and the at least one supporting structure is located in the extension channel.

3. The slide rail assembly of claim 2, further comprising a slide facilitating device mounted in the extension channel, wherein the slide facilitating device includes a plurality of rolling members in contact with the second rail.

4. The slide rail assembly of claim 1, adapted for a cable management device, wherein the cable management device includes a first arm and a second arm movable with respect to the first arm, the slide rail assembly further comprises a first connecting member coupled to the extension member and a second connecting member coupled to the second rail, the first connecting member is configured to be connected to the first arm, and the second connecting member is configured to be connected to the second aim.

5. The slide rail assembly of claim 1, wherein the second rail includes an upper wall, a lower wall, and a sidewall connected between the upper wall and the lower wall of the second rail; and when the second rail is at the predetermined position relative to the first rail, the at least one supporting structure at least supports a portion of the lower wall of the remaining rail section of the second rail.

6. A slide rail assembly adapted for a cable management device, wherein the cable management device includes a first arm and a second arm movable with respect to the first arm, the slide rail assembly comprising:
   a first rail;
   a second rail movable with respect to the first rail;
   at least one supporting structure connected to the first rail via an extension member, the extension member including an upper portion, a lower portion, and a side portion connected between the upper portion and the lower portion, the upper portion, the lower portion, and the side portion jointly defining an extension channel through which the second rail extends, and the at least one supporting structure being located in the extension channel;
   a slide facilitating device mounted in the extension channel, wherein the slide facilitating device includes a plurality of rolling members in contact with the second rail;
   a first connecting member coupled to the extension member; and
   a second connecting member coupled to the second rail;
   wherein the first connecting member is configured to be connected to the first arm, and the second connecting member is configured to be connected to the second arm; and
   wherein when the second rail is at a predetermined position relative to the first rail, the at least one supporting structure supports the second rail.

7. The slide rail assembly of claim 6, wherein the second rail includes an upper wall, a lower wall, and a sidewall connected between the upper wall and the lower wall of the second rail; and when the second rail is at the predetermined position relative to the first rail, the at least one supporting structure at least supports a portion of the lower wall of the second rail.

8. A slide rail assembly, comprising:
   a first rail;
   a second rail movable with respect to the first rail;
   a third rail mounted between the first rail and the second rail; and
   at least one supporting structure disposed at a position relative to the first rail, the at least one supporting structure being connected to the first rail via an extension member;
   wherein when the second rail is at a predetermined position relative to the first rail, the third rail and the at least one supporting structure support two portions of the second rail respectively.

9. The slide rail assembly of claim 8, wherein the extension member includes an upper portion, a lower portion, and a side portion connected between the upper portion and the lower portion; the upper portion, the lower portion, and the side portion jointly define an extension channel through which the second rail extends; and the at least one supporting structure is located in the extension channel.

10. The slide rail assembly of claim 8, adapted for a cable management device, wherein the cable management device includes a first arm and a second arm movable with respect to the first arm, the slide rail assembly further comprises a first connecting member coupled to the extension member and a second connecting member coupled to the second rail, the first connecting member is configured to be connected to the first arm, and the second connecting member is configured to be connected to the second arm.

11. The slide rail assembly of claim 8, wherein the extension member includes an extension channel through which the second rail extends; the supporting structure is a slide facilitating device; and when the second rail is at a predetermined position relative to the first rail, the third rail and the slide facilitating device support two portions of the second rail respectively.

* * * * *